United States Patent
Nayve et al.

(10) Patent No.: US 8,389,084 B2
(45) Date of Patent: Mar. 5, 2013

(54) DEVICE WITH PROTECTIVE LAYER

(75) Inventors: Regan Nayve, San Jose, CA (US);
Darren T. Imai, Los Gatos, CA (US);
Alex F. Fong, San Jose, CA (US)

(73) Assignee: FUJIFILM Corporation, Tokyo (JP)

( * ) Notice: Subject to any disclaimer, the term of this patent is extended or adjusted under 35 U.S.C. 154(b) by 576 days.

(21) Appl. No.: 12/395,510

(22) Filed: Feb. 27, 2009

(65) Prior Publication Data
US 2010/0221497 A1 Sep. 2, 2010

(51) Int. Cl.
| B32B 1/00 | (2006.01) |
| B32B 1/02 | (2006.01) |
| B32B 15/04 | (2006.01) |
| B32B 15/08 | (2006.01) |
| B32B 15/092 | (2006.01) |
| H02K 41/02 | (2006.01) |

(52) U.S. Cl. ............... 428/35.7; 428/35.8; 428/34.1; 310/12.03

(58) Field of Classification Search .............. 428/34.1, 428/34.4, 34.6, 34.7, 35.7, 35.8, 35.9, 36.6, 428/36.7; 310/12.03
See application file for complete search history.

(56) References Cited

U.S. PATENT DOCUMENTS

| 4,882,245 | A | 11/1989 | Gelorme et al. |
| 7,043,838 | B2 * | 5/2006 | Smoot et al. ............... 29/890.1 |
| 7,047,642 | B2 | 5/2006 | Kataoka et al. |
| 7,625,075 | B2 * | 12/2009 | Faase et al. ............... 347/68 |
| 2005/0099467 | A1 | 5/2005 | Bibl et al. |
| 2008/0088673 | A1 * | 4/2008 | Sexton ............... 347/54 |

FOREIGN PATENT DOCUMENTS

| JP | 11-207957 | 8/1999 |
| JP | 2002-301824 | 10/2002 |
| WO | 2009/143354 | 11/2009 |

OTHER PUBLICATIONS

Wong, "Polymers for encapsulation: Materials Process and Reliability" (1998), Chip Scale Review, 10 pages.

* cited by examiner

*Primary Examiner* — Walter B Aughenbaugh
(74) *Attorney, Agent, or Firm* — Fish & Richardson P.C.

(57) ABSTRACT

A fluid impermeable protective layer is described for a structure that has a 3-dimensional profile. The 3-dimensional profile can include actuators. The protective layer is applied so that there are no breaches in the protective layer and so that the protective layer is not too thick to prevent the actuators from being able to properly function.

12 Claims, 6 Drawing Sheets

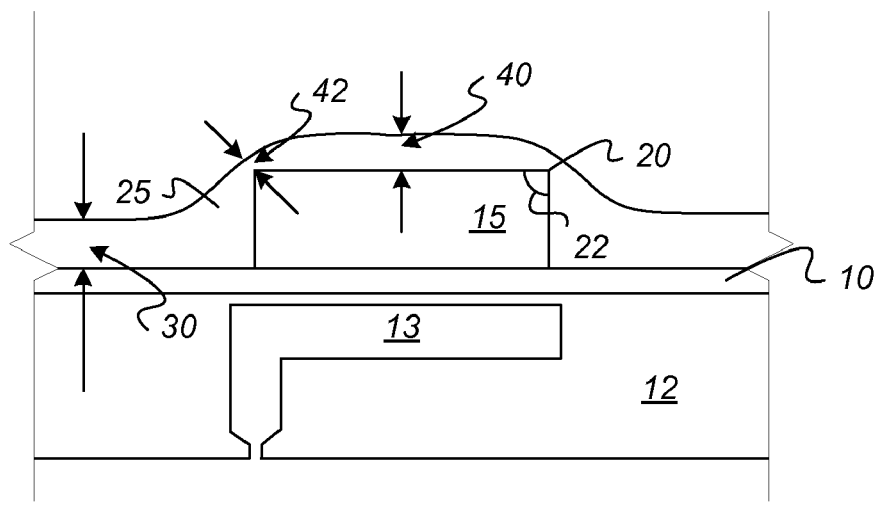
FIG._1
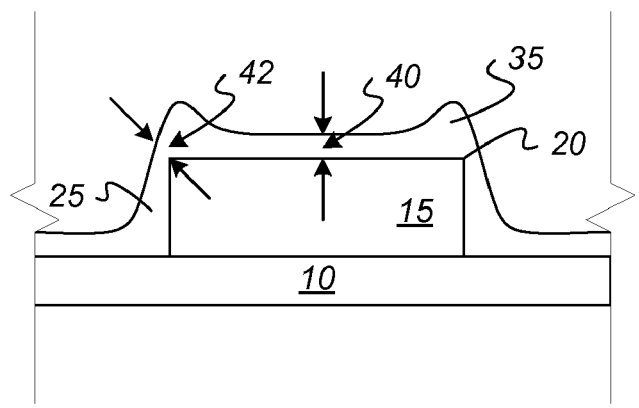
FIG._2

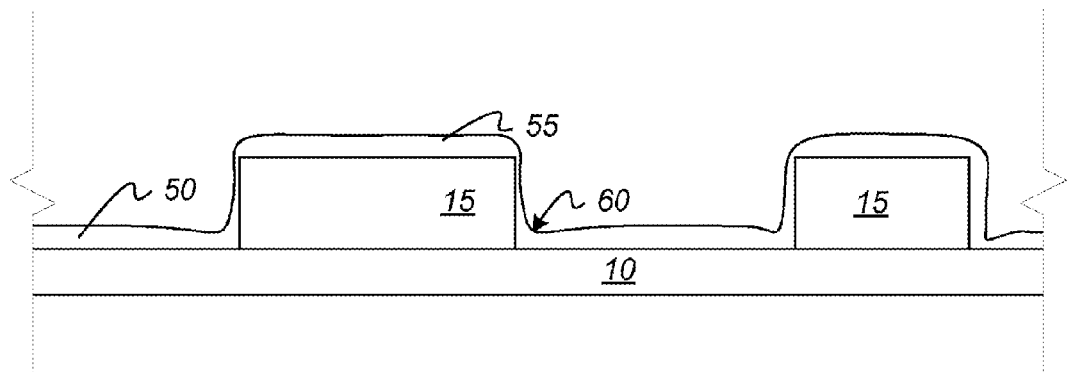
FIG._3
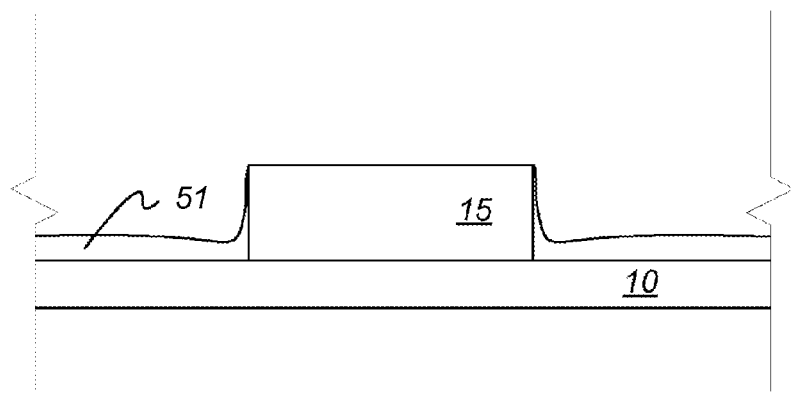
FIG._4

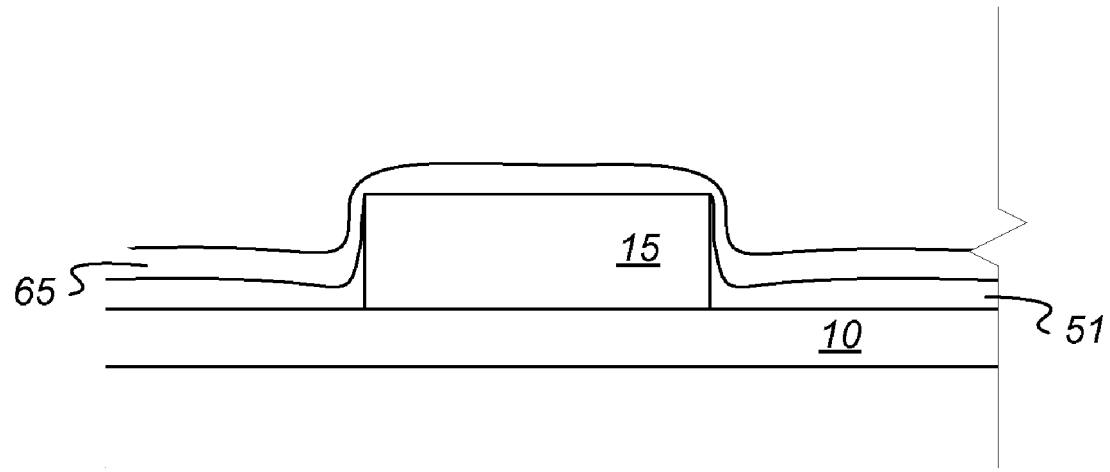
FIG._5
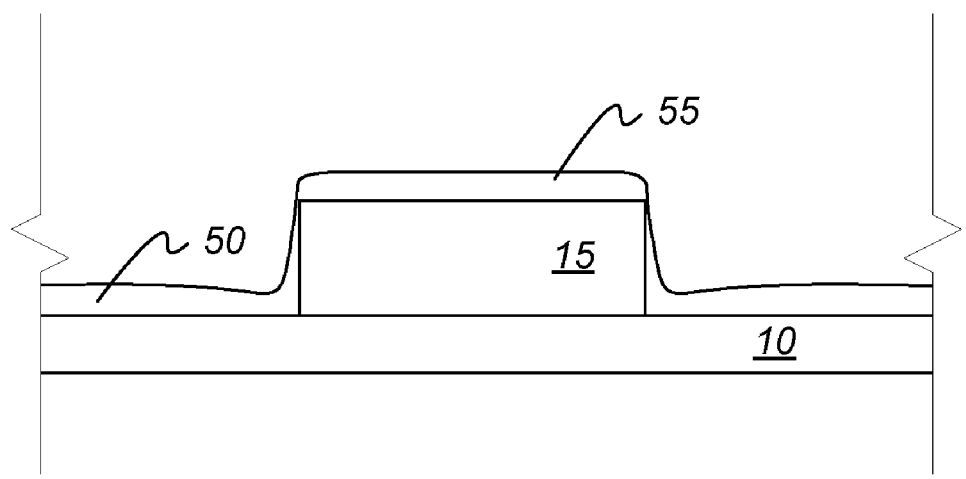
FIG._6

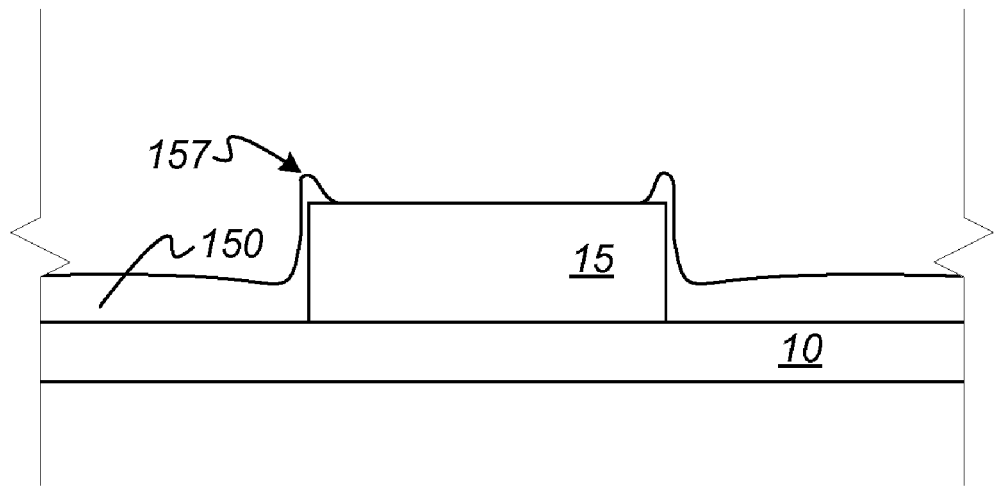
FIG._7
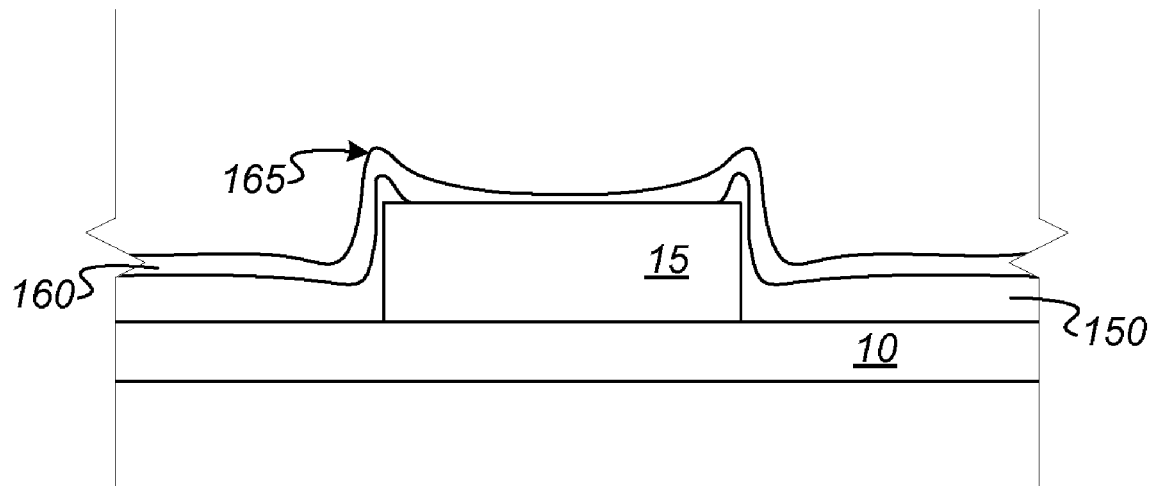
FIG._8

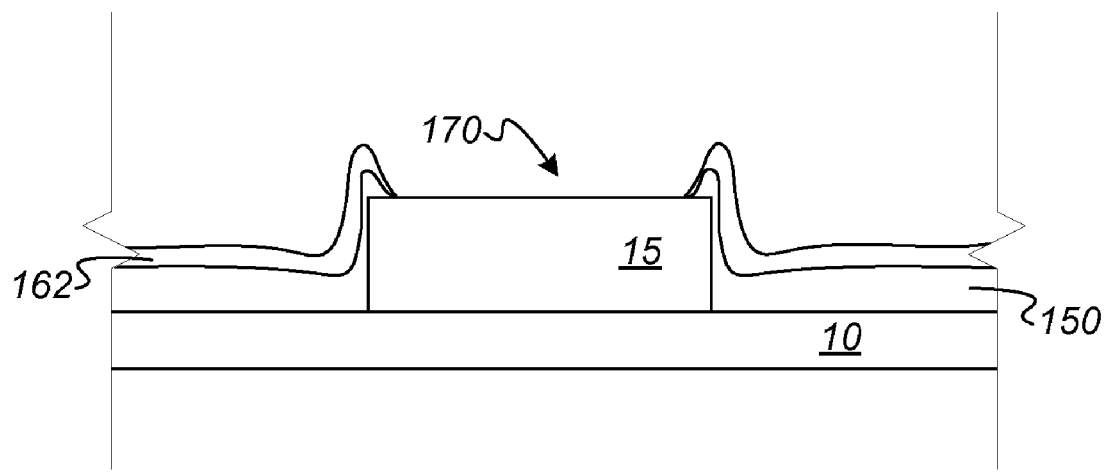
FIG._9
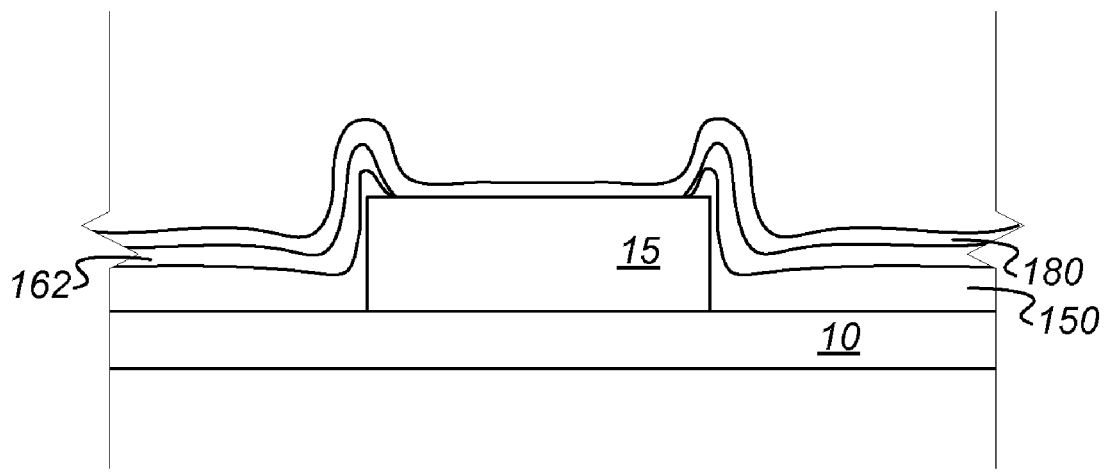
FIG._10

DEVICE WITH PROTECTIVE LAYER

BACKGROUND

The following description relates to using a photoimageable material with a MEMS device.

Photoimageable materials provide a convenient means for forming patterned layers, such as in a semiconductor device. An exemplary process for patterning photoimageable materials is to expose the materials to radiation, such as light, and developing to remove unwanted portions material and to form a desired pattern. Some types of photoimageable materials can also function as adhesive to bond components or layers. Their adhesive nature allows joining objects with a wide range of planarity or roughness. Photoimageable materials can also be used for fabrication of structures.

SUMMARY

In one aspect an actuator based device is described. The device has a body with a chamber and an actuator adjacent to the chamber. A protective layer covers the actuator. The protective layer is formed of a cured organic material. The cured organic material is derived from a resist that has a curing temperature less than 240° C.

In another aspect, a substrate is described. The substrate includes a first die and a second die. The first die is located closer to a center of the substrate and the second die is located closer to an edge of the die. The first die and the second die each include an actuator based device. A region on the first die corresponds to a region on the second die in that the regions are surrounded by a same set of features and the protective layer in the region on the first die is within about 10% of a thickness of a protective layer in the region on the second die.

In yet another aspect, a method of forming a protective layer is described. The method includes spraying a layer of curable organic material onto a device having actuators, wherein the organic material is curable at a temperature under 240° C. Organic material is removed from over a center of the actuators. A subsequent layer of curable organic material is sprayed onto the device to form the protective layer. The protective layer is a continuous layer that has a thickness of at least 1 micron in all regions.

One or more embodiments of the devices and methods described herein may include one or more of the following features. The protective layer can be a continuous layer that leaves no portion of the actuator exposed. The protective layer in a region directly adjacent to the actuator can have a thickness that is less than 5 microns. The protective layer adjacent to corners of the actuator can be at least 1 micron thick. The protective layer can be formed of SU-8. The protective layer can be less than about one half of the thickness of the actuator in a region adjacent to but not on the actuator. The protective layer can have a thickness x over a center of the actuator, a thickness y over an edge of the actuator and a thickness z adjacent to a corner of the actuator that is distal from the body, wherein x<y and z>1 micron. X can be greater than 2 microns. The protective layer can have a thickness x over a center of the actuator, a thickness y over an edge of the actuator and a thickness z adjacent to a corner of the actuator that is distal from the body, wherein x<y and z>2 microns. The actuator can include an electrode and the protective layer on the actuator can be thinner than a thickness of the electrode. The first die can have an identical feature layout to the second die. Spraying the subsequent layer can leave no portion of the actuator exposed. Spraying a layer of curable organic material can include spraying a layer of SU-8. Removing the organic material may or may not include removing the organic material from over edges of the actuator. A portion of the subsequent layer can be removed from over the actuator and a further layer can be applied onto a remaining portion of the subsequent layer and onto the actuator. A housing can be applied on a die with the protective layer formed thereon. The housing and the die together form a cavity. The cavity can be filled with a fluid so that the fluid contacts the protective layer, but the protective layer keeps the fluid from contacting the actuator. The organic material can be a resin. Over the actuators the protective layer can have a maximum thickness of one third of a thickness of the corresponding actuator. The protective layer can have a thickness on the actuator that is less than a thickness off of the actuator.

One or more embodiments of the devices and methods described herein may provide an advantage, such as one of the following advantages. A photoresist, such as SU-8, may provide a good protective layer because is it easy to apply as a thin coating over an surface with a non-flat profile. Further, SU-8 can form a uniformly thick layer, particularly when the SU-8 is sprayed onto the device. Because the material is spray coated on rather than, for example, spun onto a substrate, and multiple dies can be manufactured on a single substrate, the material can have a uniform thickness on a die that is at a center of the substrate when compared to a die at an edge of the substrate. That is, the thickness of the protective layer in a recess of a centrally located die can be within 5% of the thickness of the protective layer in a similarly situated recess of a die located closer to the edge of the substrate. SU-8 also has a sufficiently low curing temperature so that curing the SU-8 may not affect the layers that the SU-8 is applied to. Thus, curing the SU-8 may not de-pole zirconium titanate (PZT) in an actuator. Some materials, such as SU-8, tend not to shrink very much during the baking process. Because the material does not shrink very much, such as only a few percentage of the total thickness, little stress is induced in the layer or structure below the material due to baking the material and subsequent shrinking of the material. SU-8 may be applied as a conformal layer that has a minimum thickness of 0.1 microns with no breaches and a maximum thickness of 20 microns in thick regions and 5 microns in thin regions.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 1 and 2 are cross-sectional representations of coated devices.

FIGS. 3-5 show the steps of a method of coating a device.

FIGS. 6-8 show the steps of a method of coating a device.

FIGS. 9-10 show the steps of another method of coating a device.

Like reference symbols in the various drawings indicate like elements.

DETAILED DESCRIPTION

Figure 11:
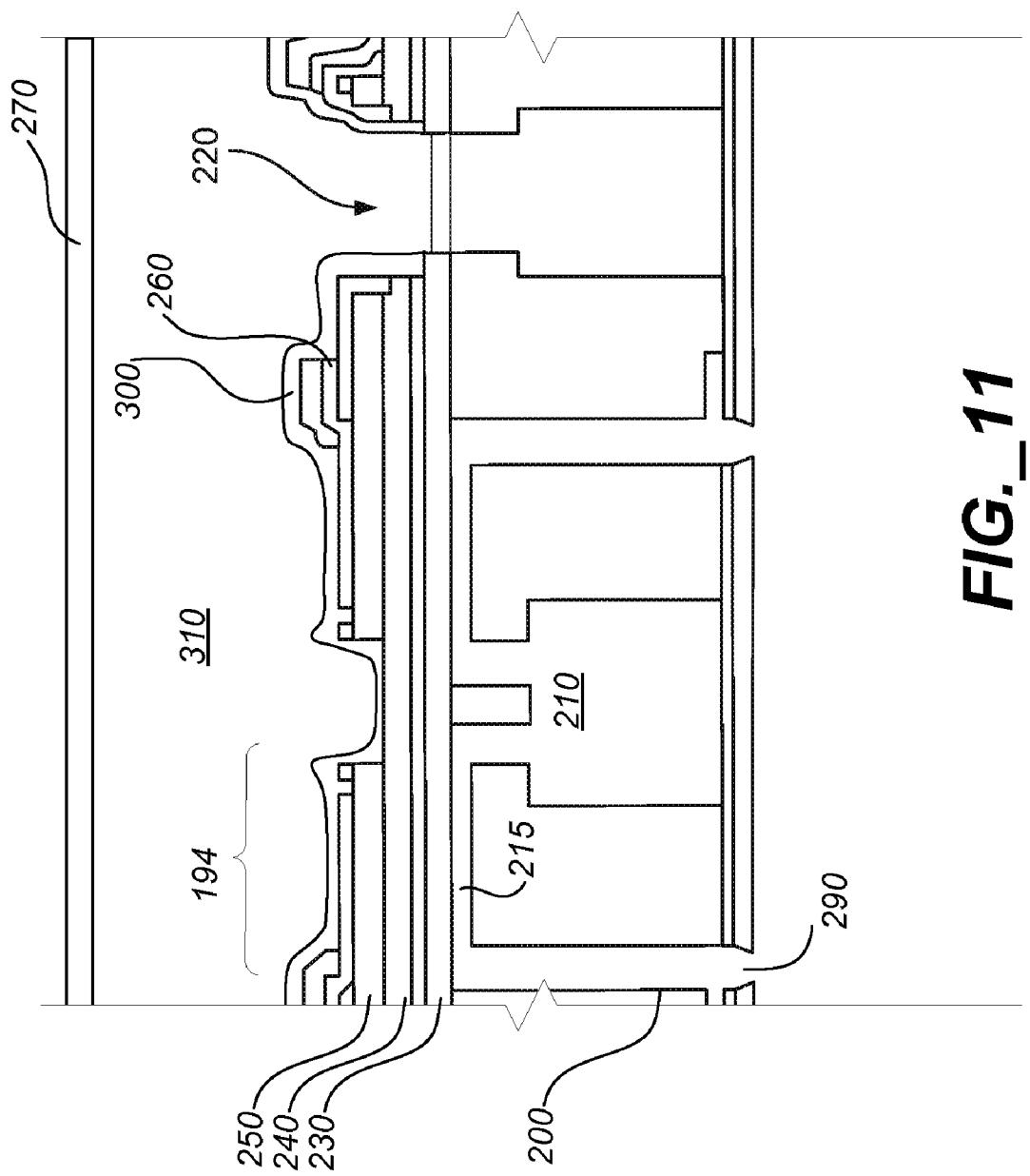
FIG. 11 shows a cross-sectional representation of a printing device with a protective coating.

Fluid dispensing devices sometimes require protection from the very fluid that they are designed to hold. This can be due to the device being formed of sensitive components, such as electronics, or porous materials, such as ceramics. For example, if the electronics are exposed to fluid, shorting can occur during operation, potentially rendering the device unusable. One way to protect the components from the fluid is to coat the components with a fluid impermeable material. A suitable material for such a coating is a conforming material that can be cured to form the impermeable layer. Thus, a material such as photoimageable material can be used.

One potential problem with forming the impermeable layer is when the components on which the layer is applied create a varied topography or an assembly with a non-flat profile. Applying a conformable layer to a non-planar surface, such as a surface with recesses and protrusions, can cause the layer to have thin portions and thick portions. The thin portions can be more prevalent near the corners of the protrusions. Thus, in order to obtain a layer that is sufficiently thick to protect the corners of any of the underlying features and is unlikely to suffer from breach, a rather thick layer may need to be applied to the entire device. However, balanced against the desire for a continuous protective layer is the undesirability of a protective layer that is too thick in some regions. In some types of devices, such as in microelectromechanical (MEMS) devices that have an actuator that needs to move when activated, an overly thick protective layer can be detrimental to device operation when the layer covers the actuator. Specifically, an overly thick protective layer on an actuator can prevent the actuator from being able to properly move, contract or expand. Additionally, some types of application for conformal materials are more prone to forming layers that are thicker in one area, such as a center of a wafer, than at another area, such as an edge of the wafer. Spin coating can form such a non-uniform layer. Thus, deposition methods other than spin coating can be desirable, such as spray coating.

Referring to FIG. 1, an exemplary protective layer 25 is shown over a feature 15. The feature 15 is on a layer 10 and has corners 20 distal to the layer 10. The protective layer 25 is formed of a conformal material, such as a resist, for example an epoxy based near-UV negative type resist, such as SU-8. As an alternative to SU-8, another type of resist that cures at a temperature lower than 240° C., such as at a temperature less than 220° C., for example, about 200° C., can be used. If the resist is spun onto the layer 10 and the feature 15, the resist can have a high likelihood of being so thin at the corners 20 of the feature that the corners 20 are exposed through the resist. In addition, a region 30 of the protective layer 25 that is on the layer 10, but not close to the feature 15 can be too thin to prevent breaching of the layer.

The protective layer 25 is applied so that the corner 20 of the feature 15 is not exposed through the protective layer 25 and the region 30 far away from the feature 15 is not too thin. In addition, the protective layer 25 is not too thick in a region 40 that is over the feature 15. In some embodiments, the feature 15 is an actuator, which needs to be able to cause bending of layers beneath the actuator when actuated. In some embodiments, the layer 10 is a conductive layer associated with the actuator. A suitable actuator can include piezoelectric material and is described further in U.S. Publication No. 2005-0099467, which is incorporated herein by reference. Contractions or expansions of the actuator cause bending in a layer adjacent to actuator. The layer adjacent to the actuator typically defines a wall of a chamber 13 in a body 12 that is adjacent to the actuator. Bending of the wall can change the size of the chamber 13. Changing the size of the chamber 13 can cause fluid in the chamber 13 to be forced out of the chamber 13. Thus, if the actuator is unable to contract or expand and therefore unable to cause bending, the device may not function properly. Thus, a maximum thickness for the protective layer 25 in region 40, that is, a region that lies over central part of feature 15, may be required to ensure proper device function.

The protective layer 25 shown in FIG. 1 has a thickness in region 40 that is sufficiently thin to allow the actuator to function. For a piezoelectric-based actuator having a thickness of between about 5 and 25 microns, such as between about 10 and 20 microns, such as between about 8 and 18 microns, such as of about 16 microns, the thickness of the protective layer 25 in region 40 is less than the thickness of the actuator, such as less than about one half of the thickness of the actuator, such as between about one quarter and one third of the thickness of the piezoelectric layer of the actuator, such as between about 1/6 and 1/4.5 of the thickness of the piezoelectric layer. For example, the protective layer in region 40 can be between about 1 and 8 microns thick, for example, between about 2 and 5 microns thick. For piezoelectric-based actuator having a thickness of between about 1 and 10 microns, such as between about 2 and 4 microns, the The protective layer 25 can be somewhat thinner in region 42, proximate to the corner 20 of the feature 15, than in region 40. In any case, corner 20 of the feature 15 does not extend through the protective layer 25 and there are no apertures in protective layer 25. The protective layer 25 is also thicker in region 30, which is distal to the feature 15, that is, in a recess formed between feature 15 and an adjacent feature (see the recess in FIG. 3 between the two features), than in the region 40 that is on the feature 15. In some embodiments, a minimum thickness of the protective layer 25 in region 42 as measured from the feature 15 is at least between 0.1 and 0.3 microns. A thickness of the protective layer 25 at the corner can be between about 1/16 and 1/5 of the thickness of the piezoelectric layer, such as between about 1/16 and 1/8 of the piezoelectric layer. In some embodiments the protective layer is great than 0.9 micron, such as greater than 1 micron, such as greater than 2 microns, such as greater than 3 microns thick in region 42.

In some embodiments, the layer 10 is a conductive layer and the actuator includes an electrode on a side of actuator opposite to the layer 10. In some embodiments, the protective layer 25 in region 30 is thinner than the electrode. If the electrode is 4 microns thick, the protective layer 25 is less than 4 microns thick in the region 40. In some embodiments, the protective layer 25 is thinner in region 30 than the thickness of feature 15. In some embodiments, in the region 30 distal from the feature 15, that is, in the recess between features, the protective layer 25 is thicker than over the center of feature 15. The thickness of the protective layer can be between about 2 and 8 microns, such as between about 4 and 5 microns. If the actuator includes a layer of piezoelectric material, the thickness of the protective layer 25 in the region 30 can be between one eighth and one half of the thickness of the piezoelectric layer, such as between about one quarter and one third of the thickness of the piezoelectric layer.

In some embodiments, the corner 20 forms an angle 22 that is about 90 degrees. In other embodiments, the angle 22 is greater than 90 degrees, such as between 90 and 120 degrees. A process that forms the protective layer 25 at the corner to be 1 microns thick on a 90 degree corner can form a thicker layer at the corner, such as a layer that is 1.3 microns thick, on a 120 degree corner. Thus, the angle of the corners on the feature can determine how thick the protective layer ratio is between the corner regions and the central region of the feature.

Referring to FIG. 2, in another embodiment, the protective layer 25 is formed with shoulders 35 over the corners 20 of the feature 15. The shoulders 35 are areas of the protective layer 25 that are thicker than at the center region 40 of the protective layer 25. In some embodiments, the shoulders are about 0.5 to 1 micron thicker than the protective layer over the feature 15. In some embodiments, the feature 15 is an actuator and the corners 20 do not have as much effect on the action of the actuator. Thus, the thickness of the protective layer over the center of the feature 15 is kept below a predetermined thickness, such as 5 microns. The thickness of the protective layer 25 in the area 42, which is near shoulders 35, but measured to obtain the least thickness of protective material from the corner is between about 1 and 3 microns, such as between about 1 and 2 microns.

The methods of forming a protective layer that does not expose the feature or the layer beneath the protective layer are described with respect to the following figures. Only FIG. 3 shows multiple features 15, but any of the devices can have multiple features 15 and thus recesses between the features 15.

Referring to FIG. 3, a first layer 50 of conforming material is applied to conductive layer 10 and feature 15. The first layer 50 is applied by spray coating. An exemplary spray coater that is capable of applying a layer of resist on a 3-dimensional microstructure is the Gamma Alta Spray from Suss MicroTec, Waterbury Center, Vt. The resist that is used to coat the layer can be SU-8. The SU-8 can have a viscosity suitable for spray coating, such as a viscosity of between about 10 and 25 centipoise at room temperature, such as of about 12 centipoise. Suitable SU-8 can be obtained from MicroChem Corp., Newton, Mass. A standard type of SU-8 can be made less viscous by adding a material that thins the SU-8, such as cyclopentanone or gamma butrolactone (GBL). To apply the SU-8, the nozzle distance setting can be about 3, sprayed at 0.2 ml/s, moving the nozzle at 50 mm/s at 50° C. The resist can then be baked at 65° C. for 2 minutes and then 90° C. for 2 minutes.

The thickness of the layer of resist in a region 55 on the feature 15 is about equal to a thickness of the resist in a region 50 between features 15. If the feature is an actuator, the thickness is less than one half of the thickness of the piezoelectric material thickness. In a region on the layer 10, not over the feature 15, but adjacent to the feature 15 the layer tends to exhibit a dip 60 in thickness. This dip 60 or recess causes the layer to be thinner here than in a region 50 of the recess further from the feature 15.

Referring to FIG. 4, the portions of the SU-8 that are on the feature are covered by a mask and the SU-8 that is in the recesses is exposed. For example, the SU-8 can be exposed through that mask to about 1000 mJ/cm$^2$. A post bake is then performed at 65° C. for 2 minutes and then 90° C. for 2 minutes. The SU-8 on top of the features is then removed with developer. This strips the SU-8 from over the feature 15 leaving a portion 51 of the first layer adjacent to the feature 15. In some embodiments, the mask has apertures that do not overlap with top surfaces of the feature and the top surfaces are entirely stripped of SU-8.

The two step application process can eliminate thin spots, that is, spots that are thinner than 0.9 microns in regions next to the feature where the dip 60 typically can occur. The lack of thin spots can occur concurrent with maintaining a maximum thickness of 5 microns over the feature 15.

Referring to FIG. 5, a second layer 65 of SU-8 is deposited on top of the feature 15 and the portion 51 of the first layer that is not on the top of the feature 15. The second layer 65 and the portion 51 of the first layer together in regions between features 15 have a maximum thickness of less than one half the height of the feature, or less than one half of the thickness of the piezoelectric material if the feature is an actuator. The thickness of the second layer 65 is the entire thickness of the layer over the feature 15. Thus, the thickness of the SU-8 on top of the feature 15 is less than the thickness in the recesses between the features 15. The SU-8 can be subjected to a final cure at 200° C. for 2 hours.

Referring to FIG. 6, a similar spray coating process is performed as described with respect to FIG. 3. However, the region 55 over the feature 15 is not completely stripped away. Rather, the mask does not cover the SU-8 layer that overlies one or more edges of the feature 15. Thus, as shown in FIG. 7, when the first layer 50 is patterned, the part of the first layer that remains is between features 15 and on one or more edges of the feature 15. Shoulders 157 of SU-8 are left on the edges of the feature by the exposure and developing steps.

In some embodiments, depending on the profile of the feature 15, the thickness of the protective layer that is formed on an edge of the feature 15 that is protected by the mask is only slightly thinner than the thickness on the edge that is not protected by the mask during exposure. This difference can be as little as 0.1 or 0.2 microns. However, even a small difference in thickness can provide an impermeable protective layer.

Referring to FIG. 8, a second layer 160 of SU-8 is applied. The second layer 160 forms a protective layer that is thickest in the recesses between features, and thinnest on a central portion of the feature. The shoulders 157 formed by the layer application, exposure and development of the first layer of SU-8 form even taller shoulders 165. However, only the SU-8 thickness at the very edge of the feature is made thicker than the thickness of the layer at the center of the feature, such as only the 10 microns within the edge of the feature or only less than 5 microns from the edge of the device.

Referring to FIG. 9, while the embodiment shown in FIG. 8 can be the final protective layer, the steps of patterning can be performed again to remove any of the second layer 160 from over the center 170 of the feature 15. This forms an even thicker layer of protective material at the edges of the feature 15. The patterned second layer 162 remains over the recesses between features 15. Referring to FIG. 9, a third layer 180 of SU-8 is applied over the feature 15, over the shoulders of SU-8 on the feature 15 and on the layer 10, next to and between features 15, as shown in FIG. 10.

Referring to FIG. 11, a cross sectional view of a device for fluid ejection is shown. The body 200 of the device has fluid chambers 210, 215 and flow paths therein. Covering the fluid flow path and chambers is a membrane 230. On a side of the membrane 230 opposite to the chambers 210, 215 is an actuator formed of layers that are sensitive to exposure to the fluid that is in the chambers. The actuator can include a lower conductive layer 240, or lower electrode, a layer of piezoelectric material 250, and an upper conductive layer 260, or upper electrode. A protective layer 300 covers the upper electrode, piezoelectric material 250 and any other portions of the actuator that are not covered by an adjacent layer. The body 200 is formed of a material that is resistance to corrosion from being exposed to the fluid.

The actuator is housed within a housing 270. This forms a chamber 310 into which the fluid can be introduced. The fluid fills the body 200 through fill holes 220, which are in fluid communication with the chambers 210, 215. When a bias is applied to the actuator in an active region 194, that is, a region that overlies a pumping chamber 215, the piezoelectric material contracts or expands. This change in thickness causes the membrane 230 over the pumping chamber 215 to bend. Applying the voltage as a series of pulses changes the volume of the chamber 215, which forces fluid in the chamber to be pushed out of a nozzle 290. Keeping fluid surrounding the electronics can provide advantages, such as maintaining a constant temperature of the electronics. However, because the fluid can damage the electronics, the protective layer 300 completely covers the electronics so that fluid cannot contact the electronics and cause shorting or corrosion.

SU-8 can provide a good protective layer because is it easy to apply as a thin coating over an actuator. Further, SU-8 can form a uniformly thick layer, particularly when the SU-8 is sprayed onto the device rather than spun on. Spin coating can form thicker layers than desirable, such as layers that are greater than 25 or 30 microns thick. Because the material is spray coated rather than spun onto a substrate and multiple dies can be manufactured on a single substrate, the material has a uniform thickness on a die that is at a center of the substrate when compared to a die at an edge of the substrate or that is on a die at one end of the substrate compared with a die at the other end of the substrate. That is, the thickness of the protective layer in a recess of a one die, such as a centrally located die or a die at an end of the substrate is within 10% of the thickness of the protective layer in a similarly situated recess of a die located closer to the edge of the substrate or at the other end of the substrate.

SU-8 also has a sufficiently low curing temperature so that curing the SU-8 will not affect the layers that the SU-8 is applied to. When PZT is used for an actuator, the actuator cannot be brought to temperatures too high because the PZT de-poles at high temperatures, such as temperatures above 240° C. Thus, the curing temperature of SU-8, which is around 200° C., can allow SU-8 to be applied as a conformal layer that has a minimum thickness of 0.1 microns with no breaches and a maximum thickness of 20 microns in thick regions and 5 microns in thin regions and for the SU-8 to be cured in place without adversely affecting other layers of the device.

A number of embodiments of the invention have been described. Nevertheless, it will be understood that various modifications may be made without departing from the spirit and scope of the invention. Accordingly, other embodiments are within the scope of the following claims.

What is claimed is:

1. An actuator based device, comprising:
   a body containing a chamber to receive a fluid;
   a piezoelectric actuator adjacent to the chamber, the piezoelectric actuator being in the form of a layer and comprising
      a first surface facing the chamber,
      a second surface opposite to the first surface, the second surface being away from the chamber, the second surface comprising a center region,
      at least one edge surface between the first surface and the second surface, and
      at least one corner connecting the second surface and the at least one edge surface,
   wherein the actuator is configured to change a size of the chamber to force the fluid out from the chamber on a side of the body away from the piezoelectric actuator, and
   a protective layer on a side of the actuator farther from the chamber, the protective layer having a lower surface and an upper surface opposite to the lower surface, the lower surface covering the actuator, and the upper surface facing a direction away from the chamber and being free from being covered by any additional materials, the protective layer covering the center region, the at least one edge surface, and the at least one corner, wherein a portion of the protective layer covering the center region is sufficiently thin to allow the actuator to contract or expand when the actuator is activated, and wherein the protective layer is formed of a cured organic material, wherein the cured organic material is derived from a resist that is curable at a temperature lower than 240° C.

2. The device of claim 1, wherein the protective layer is a continuous layer that leaves no portion of the actuator exposed.

3. The device of claim 1, wherein the protective layer in a region over the center region of the actuator has a thickness that is less than 5 microns.

4. The device of claim 3, wherein the protective layer in a region over the at least one corner of the actuator is at least 1 micron thick.

5. The device of claim 1, wherein the protective layer is formed of an epoxy-based near-UV negative photoresist.

6. The device of claim 1, wherein the protective layer is less than about one half of the thickness of the actuator in a region that is next to the at least one edge surface of the actuator and not over the actuator.

7. The device of claim 1, wherein the protective layer has a first thickness over the center region of the actuator, a second thickness in a region that is next to the at least one edge surface of the actuator and not over the actuator, and a third thickness over the at least one corner of the actuator, wherein the first thickness<the second thickness and the third thickness>1 micron.

8. The device of claim 7, wherein the first thickness>2 microns.

9. The device of claim 7, wherein the third thickness>2 microns.

10. The device of claim 1, further comprising an electrode between the protective layer and the piezoelectric actuator and the protective layer covering the actuator is thinner than a thickness of the electrode.

11. A substrate, comprising:
    a first die and a second die, wherein the first die is located closer to a center of the substrate and the second die is located closer to an edge of the substrate, the first die and the second die each include the actuator based device of claim 1;
    wherein a region on the first die corresponds to a region on the second die in that the regions are surrounded by a same set of features and the protective layer in the region on the first die is within about 10% of a thickness of a protective layer in the region on the second die.

12. The substrate of claim 11, wherein the first die has an identical feature layout to the second die.

* * * * *